US006525361B1

United States Patent
Lu et al.

(10) Patent No.: US 6,525,361 B1
(45) Date of Patent: Feb. 25, 2003

(54) PROCESS AND INTEGRATED CIRCUIT FOR A MULTILEVEL MEMORY CELL WITH AN ASYMMETRIC DRAIN

(75) Inventors: Tao Cheng Lu, Kaohsiung (TW); Chung Ju Chen, Hsinchu (TW); Hon Sui Lin, Tainan (TW); Mam Tsung Wang, Hsinchu (TW); Chin Hsi Lin, Hsinchu (TW); Ful Long Ni, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/443,964

(22) Filed: Nov. 19, 1999

Related U.S. Application Data

(62) Division of application No. 09/124,704, filed on Jul. 29, 1998, now abandoned.

(51) Int. Cl.[7] ............................................. H01L 27/102
(52) U.S. Cl. ..................... 257/297; 257/404; 257/390; 257/305; 257/391
(58) Field of Search .............................. 257/296, 288, 257/390, 391, 404, 403, 402, 297, 300, 304, 305

(56) References Cited

U.S. PATENT DOCUMENTS

| | | | |
|---|---|---|---|
| 5,117,389 A | 5/1992 | Yiu | 365/104 |
| 5,214,303 A | 5/1993 | Aoki | 257/390 |
| 5,218,571 A | 6/1993 | Norris | 365/189.09 |
| 5,506,813 A | 4/1996 | Mochizuki et al. | 365/230.03 |
| 5,526,306 A | 6/1996 | Hikawa et al. | 365/182 |
| 5,548,549 A | 8/1996 | Ong | 365/185.05 |
| 5,585,297 A | 12/1996 | Sheng et al. | 437/52 |
| 5,661,054 A | 8/1997 | Kauffman et al. | 438/257 |
| 5,661,326 A | 8/1997 | Hong | 257/402 |
| 5,668,029 A | 9/1997 | Huang | 438/278 |
| 5,680,343 A | 10/1997 | Kamaya | 365/104 |
| 5,726,929 A | 3/1998 | Suminaga | 365/104 |
| 5,732,022 A | 3/1998 | Kato et al. | 365/185.24 |
| 5,796,149 A | 8/1998 | Sugaya et al. | 257/391 |
| 5,811,862 A | * 9/1998 | Okugaki et al. | |
| 5,891,779 A | 4/1999 | Chung et al. | 438/276 |

FOREIGN PATENT DOCUMENTS

| | | |
|---|---|---|
| DE | 195 41 469 | 11/1995 |
| JP | 08-316341 | 11/1996 |

* cited by examiner

*Primary Examiner*—Nathan J. Flynn
*Assistant Examiner*—Victor A. Mandala, Jr.
(74) *Attorney, Agent, or Firm*—Mark A. Haynes; Haynes Beffel & Wolfeld LLP

(57) ABSTRACT

An asymmetric multilevel memory cell provides an inhibited source read current. The inhibited source read current dramatically reduces the likelihood of a cell type misread error for a memory array comprising multilevel cells. The method for fabricating the asymmetric multilevel memory cell comprises a source only implant, formation of a spacer on the drain side of the gate prior to source/drain implant, and the resultant formation of an offset region disposed between the channel and the drain. The offset region is not controlled by the gate voltage. The drain current at 1.5 volts is more than 3.5 times larger than the source current at 1.5 volts for spacer width of 0.12 micrometers. Asymmetric multilevel memory cells in a memory array, where the cells have a common source configuration, are accurately read in one direction because neighboring cells on the word line have substantially lower source current than the read cell drain current.

6 Claims, 16 Drawing Sheets

PROCESS AND INTEGRATED CIRCUIT FOR A MULTILEVEL MEMORY CELL WITH AN ASYMMETRIC DRAIN

This application is a division of U.S. patent application Ser. No. 09/124,704, filed Jul. 29, 1998 now abandoned.

BACKGROUND OF THE INVENTION

1. Field of Invention

The present invention relates to integrated circuit memories, and more particularly to multiple binary digit (bit) per cell metal oxide semiconductor (MOS) integrated circuit memory devices.

2. Description of Related Art

The cost of integrated circuit memory devices is closely related to the amount of area on an integrated circuit that is required to store a given amount of data, a parameter often referred to as the density of the device. By saving area on an integrated circuit, a manufacturer is able to make more chips with a given wafer in the fabrication factory. More chips per wafer translates directly to cost savings which can be passed on to the consumers of the memory devices.

One approach for increasing the density of memory devices is to store more than one bit per memory cell. Thus for example, the ability to store two bits per cell provides twice the data density on an integrated circuit.

Multiple bit per cell technologies have been developed for floating gate memory devices. See U.S. Pat. No. 5,163,021 to Mehrotra, et al. However, the floating gate memory approach involves complex charging and discharging of the floating gates, and difficult sensing technology, which increases the complexity and reduces the reliability of the devices.

Accordingly, there is a need for a simpler, reliable, low cost technique for implementing multiple bits per memory cell in an integrated circuit.

SUMMARY OF THE INVENTION

The present invention provides a technique for storing multiple bits per cell in an integrated circuit having asymmetric memory cells. A substantial source of error is found in memory arrays comprising symmetric memory cells. The source of error is alternative current paths through neighboring memory cells. These alternate current paths can alter the drain read current of the cell of interest so that it is read as a different type of cell. The asymmetric cells are adapted to dramatically reduce source read current. Appropriate placement of the asymmetric cells in a memory array makes use of the reduced source read current to ensure that multilevel cells in the memory device are accurately read. The invention thereby eliminates the error from alternative current paths.

In some embodiments of the invention, the memory cell has a drain, a source, and a channel disposed between the drain and the source, all of which are provided in a substrate of the memory cell. In the asymmetric memory cell, the channel is spaced laterally from the drain. The lateral distance separating the gate from the drain is an offset. An offset region is disposed in the substrate. The offset region is disposed between the drain and the channel.

The memory cell has a plurality of bits stored in the channel. The MOS device has sets of memory cells. Memory cells of a particular set have a different threshold voltage than the memory cells from a different set. The threshold voltages depend upon a dopant concentration in the channel regions. Each bit of information corresponds to the threshold voltage of the cell.

A first group of embodiments of the invention provides a method for forming multilevel cells in a memory array on a substrate. The memory array has a plurality of multilevel cells. Each multilevel cell comprises a gate, a gate oxide, a channel, a drain, and a source. The gate is disposed above the gate oxide. The gate oxide has a top. The channel is disposed in the substrate and is aligned with the gate. The drain is disposed in the substrate. The drain is located on a first side of the gate. The source is disposed in the substrate and disposed on a second side of the gate. The second side is opposite the first side.

The method for forming the multilevel cell comprises directing a source only implant, forming a first spacer, and directing a source/drain implant. The source only implant is directed into the source of each multilevel cell.

The first spacer is formed on the first side of the gate and extends upwards from the top of the gate oxide. The first spacer has a first spacer width. The first spacer width is adapted to provide an offset between the channel and the drain of each multilevel cell.

The source/drain implant is directed into both the source and the drain of each multilevel cell. Through these steps an offset region is formed. The offset region is disposed between the channel and the drain. The offset region is adapted to inhibit a source read current.

For some embodiments of the first group, the first spacer width is in a range from approximately 0.05 micrometers to approximately 0.20 micrometers. The offset is smaller than the first spacer width. For some embodiments the size of the offset is greater than approximately fifty percent (>50%) of the first spacer width.

For some embodiments of the first group, the method further comprises directing a first channel implant, directing a first code implant, directing a second code implant, forming the gate oxide, depositing a first conductive layer, patterning the gate from first conductive layer, and masking the drain; prior to directing the source only implant.

The first channel implant is directed into all of the multilevel cell channels. The first code implant is directed into a first selected group of multilevel cell channels. The second code implant is directed into a second selected group of multilevel cell channels. The second code implant has a different projected range than the first channel implant. The second code implant also has a different projected range, i.e., depth profile, than the first code implant. Each multilevel cell has a bit code selected from a group of four different bit codes. Each of the four different bit codes corresponds to a specific combination of the first channel implant, the first code implant, and the second code implant.

More generally, the code implants may be directed as n code implants into n different selected groups of multilevel memory cell channels. Each of the n implants has a set of implant characteristics different than the other n−1 code implants. Each multilevel memory cell can have a bit code selected from a group of $2^n$ different bit codes. Each of the $2^n$ different bit codes corresponds to a specific combination of the first channel implant and the n code implants. For some embodiments, the set of implant characteristics comprises projected range and the number of implanted ions.

For some embodiments of the first group, the method further comprises depositing a second conductive layer and patterning the second conductive layer; after directing the source/drain implant.

For some embodiments of the first group, the method further comprises forming a second spacer on the second side of the gate, the second spacer extending upwards from the top of the gate oxide.

A second group of embodiments of the invention provides a MOS memory cell in an integrated circuit. The integrated circuit has a substrate. The MOS memory cell has a source formed in the substrate and a gate. The MOS memory cell also has a gate oxide disposed between the substrate and the gate. The MOS memory cell further comprises a drain, a channel, and an offset region. The drain is formed in the substrate and has a width.

The channel is formed in the substrate. The channel is in contact with the gate oxide. The channel is aligned with the gate. The channel extends at least a portion of the distance from the source towards the drain. The channel is separated from the drain by an offset. The channel is adapted to store multiple bits.

For some embodiments, the channel is adapted to form a depletion layer in a region of the channel proximal to the gate oxide in response to a gate voltage.

The offset region has an initial conduction state. The offset region is adapted to maintain the original conduction state proximal to the gate oxide in response to the gate voltage. The MOS memory cell has a drain read current corresponding to a drain voltage and a source read current corresponding to a source voltage. The source voltage is equal to the drain voltage. The drain read current has a different value than the source read current.

For some of the embodiments of the second group, the source read current is smaller than the drain read current, the offset region is adapted to form a depletion layer proximal to the gate oxide in response to the drain voltage, the offset is in a range from approximately 0.02 micrometers to approximately 0.20 micrometers, and the offset region is adapted to maintain its original conduction state proximal to the gate oxide in response to the source voltage.

For some embodiments of the second group, the gate has a gate width. The gate also has a first side, a second side opposite the first side, a bottom, and a top. The gate width is the distance between the first side and the second side. The gate is disposed between the source and the drain. The gate is disposed above the gate oxide. The drain is disposed on the first side and the source is disposed on the second side. The gate width is smaller than the distance between the source and the drain. The gate oxide has a top. In this embodiment, the MOS memory cell further comprises a first spacer disposed along the first side of the gate. The first spacer extends upwards from the top of the gate oxide. The first spacer also has a first spacer width.

A third group of embodiments of the invention provides an integrated circuit comprising an array of memory cells, a bit line, and a word line. The memory cells comprise transistors having channels in channel regions of a substrate. Selected memory cells in the array store multiple bits in their channels.

The word line and the bit line are coupled respectively with rows and columns of memory cells in the array by which to read data stored in the array. The bit line comprises a first patterned layer of the integrated circuit. The word line comprises a second patterned layer of the integrated circuit.

Each of the selected memory cells has a source formed in the substrate, a gate, and a gate oxide disposed between the substrate and the gate. Each of the selected memory cells further comprises an asymmetric drain, a channel, and an offset region. The asymmetric drain is formed in the substrate and has a width.

The channel is formed in the substrate. The channel is in contact with the gate oxide. The channel is aligned with the gate. The channel extends from the source towards the asymmetric drain. The channel is separated from the asymmetric drain by an offset. The channel is adapted to store multiple bits. The channel is adapted to form a depletion layer in a region of the channel proximal to the gate oxide in response to a gate voltage.

The offset region has an initial conduction state. The offset region is adapted to maintain the original conduction state proximal to the gate oxide in response to the gate voltage.

Each of the selected memory cells has a drain read current corresponding to a drain voltage and a source read current corresponding to a source voltage. In response to the application of the source voltage at a first time and the drain voltage at second time, current in the integrated circuit flows in a first direction at the first time and a second directions at the second time. The second direction is opposite the first direction. The source voltage is equal to the drain voltage. The drain read current has a different value than the source read current.

The offset of each selected memory cell transistor is sufficiently large to ensure that the selected memory cell transistors can only be accurately read by the corresponding word lines and corresponding bit lines in one direction.

For some embodiments of the third group, the offset is in a range from approximately 0.02 micrometers to approximately 0.20 micrometers. The offset region is adapted to form a depletion layer proximal to the gate oxide in response to the drain voltage, and the offset region is adapted to maintain the initial conduction state proximal to the gate oxide in response to the source voltage.

For some of the embodiments of the third group, the gate of each of the selected memory cells is addressable by a corresponding word line. The integrated circuit further comprises a sense amplifier, a ground, a first selected memory cell transistor, and a second selected memory cell transistor.

The sense amplifier has a conductor, a first side, and a second side. The ground has a conductor, a first side, and a second side. The bit line is disposed proximal to the ground conductor. The bit line is disposed on the first side of the ground conductor. The bit line is disposed proximal to the sense amplifier conductor. The bit line is disposed on the second side of the sense amplifier conductor.

The first selected memory cell transistor is disposed between the bit line and the second side of the sense amplifier conductor. The drain of the first selected memory cell transistor is in communication with the sense amplifier conductor.

The second selected memory cell transistor is disposed between the bit line and the first side of the ground conductor. The drain of the second selected memory cell transistor is in communication with the ground conductor. The first selected memory cell transistor and the second selected memory cell transistor have a common source. The bit line is in communication with the common source of the first and second selected memory cell transistors. Wherein, the first memory cell transistor can only be accurately read by the corresponding word line and the corresponding bit line in a first direction. The second memory cell transistor can only be accurately read by the corresponding word line and the corresponding bit line in a second direction. The second direction is opposite the first direction.

For some of the embodiments the integrated circuit further comprises a sense amplifier, a ground, a first selected memory cell transistor, and a second selected memory cell transistor. For these embodiments, the first direction is from the drain of the first selected memory cell to the source of the first selected memory cell. The second direction is from the drain of the second selected memory cell transistor to the source of the second selected memory cell transistor.

A portion of the second direction current flows from the source of the first selected memory cell transistor to the drain of the first selected memory cell transistor. The portion of the second direction current in the first selected memory cell transistor is less than forty percent of the second direction current of the second selected memory cell transistor. A portion of the first direction current flows from the source of the second selected memory cell transistor to the drain of the second selected memory cell transistor. The portion of the first direction current in the second selected memory cell transistor is less than forty percent of the first direction current of the first selected memory cell transistor.

A fourth group of embodiments of the invention provides a method of reading a memory cell having an offset. The method comprises providing the memory cell, where the memory cell is an asymmetric memory cell. For some embodiments in this group, the asymmetric cell is a multilevel cell.

DETAILED DESCRIPTION

Figure 1:
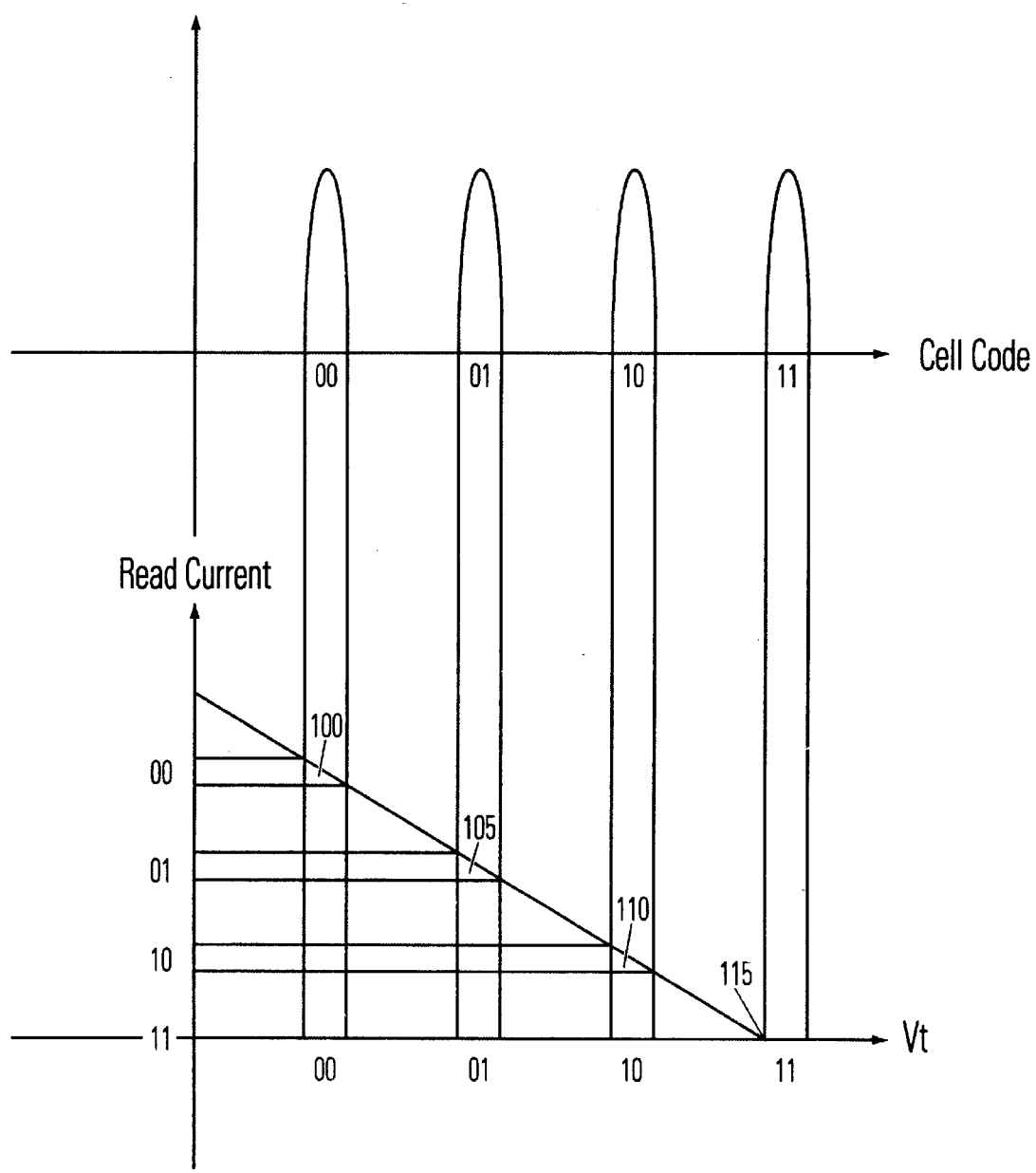
FIG. 1 is a graph illustrating the relationship between the drain read current and the threshold voltage for a two-bit level memory cell with four different codes.

A process for fabrication and an integrated circuit for implementing a multilevel memory cell with an asymmetric drain are disclosed with respect to FIGS. 1–13. In the following description, for purposes of explanation, specific nomenclature is set forth to provide a thorough understanding. However, many of these specific details are not required to practice the invention.

For an integrated circuit to take full advantage of the memory density improvement offered by a multilevel memory cell, the integrated circuit must accurately read the bit code for each type of multilevel cell. Each set of multilevel cells has a particular bit code value. Each bit code value is defined by a unique threshold voltage (Vt). In the absence of drain current read error sources that arise for prior art symmetric memory cells, the bit codes are readily differentiated because each cell type has a unique threshold voltage which can be determined by reading the drain current of the cell. However, a substantial source of error is found in prior art memory arrays comprising symmetric memory cells. The source of error results from the existence of alternative current paths through neighboring memory cells which can alter the drain read current of the cell of interest so that it is read as a different type of cell.

A new asymmetric cell structure is provided by the invention. The invention asymmetric cells are adapted to dramatically reduce source read current. Appropriate placement of the asymmetric cells in a memory array makes use of the reduced source read current to ensure that multilevel cells in the memory device are accurately read. The invention thereby eliminates a substantial source of error from alternative current paths. The asymmetric cell is especially well suited for multilevel masked ROM integrated circuits.

Multilevel Memory Cells

The different threshold voltages are accomplished by combining different implants in the channel of each cell. Different combinations of the implants provide a unique threshold voltage for each type of cell in the array.

A series of n code implants are directed into selected memory cell channels after an initial shallow threshold voltage implant is directed into all the memory cell channels. Each of the code implants have a set of implant characteristics different from the other code implants and different from the initial threshold voltage implant. The code implants are adapted to provide clearly distinct threshold voltages for a range of substrate bias voltages. The set of distinguishing ion implant characteristics comprises projected range and number of implanted ions. Different combinations of the different code implants provide memory cells storing multiple bits per cell.

Table 1 and Table 2 provide a basis for determining the number of bits per cell that will be obtained for a given number of code implants, when a first channel implant, i.e., the initial threshold voltage (Vt) implant, is directed at all of the memory cells in the memory array.

In the simplest case a single code implant is directed at selected memory cells in order to form a one-bit memory array. In this example, n=1 and only. one bit is stored in each memory cell, either a 0 (no code implant directed at the cell) or a 1 (the code implant was directed at the cell). For n=1, each memory cell has a one-bit code selected from the group of 0 and 1, or from a selection group of two bit codes. Also, for n=1, the memory array comprises two types of memory cells, cell 0 and cell 1. Note that the number of bit codes in the selection group is identical to the number of cell types in the memory array.

Based on this example and those provided below, we establish a relationship between the number of bit codes in the selection group (S) and the number of code implants directed into the selected memory cells, where S is equal to $2^n$. For the n=1 example, we find that $S=2^1=2$.

Table 1 lists the multiple bits per cell when n=2, or two distinguishable code implants are directed into the selected cell channels. According to our postulated relationship, for two code implants (n=2), the number of bit codes in the selection group is $S=2^n=2^2=4$. Therefore, as seen by Table 1, our postulated relationship ($S=2^n$) holds true for n=2.

For n=2, as shown in Table 1, the memory array comprises four types of memory cells. The four cell types are provided by combining two code implants with the first channel implant. The combinations are incorporated into a two-bit level memory cell array. In the example discussed herein, the first code implant has a smaller projected range (because of a lower implant energy) than the second code implant. The first cell type 00 has only the first channel implant, i.e., it has no additional code implant. The second cell type 01 has an additional second code implant. A third cell type 10 has an additional first code implant. A fourth cell type 11 has an additional first code implant and an additional second code implant.

TABLE 1

| First Channel Implant | First Code Implant | Second Code Implant | Cell Type |
|---|---|---|---|
| Y | N | N | 00 |
| Y | Y | N | 01 |
| Y | N | Y | 10 |
| Y | Y | Y | 11 |
| Two-bit Level cell | Number of Code Implants = 2 = n | | Number of Cell Types = $2^n$ = 4 |

The graph in FIG. 1 illustrates the relationship between the drain read current and the threshold voltage for a two-bit level memory cell with a selection group comprising four different bit codes. In this example, each type of cell is distinguished from a different type of cell by its drain read current for a given voltage. As shown in FIG. 1, 00 cell current/voltage characteristics 100 comprise the highest drain read current and the lowest threshold voltage, while 11 cell current/voltage characteristics 115 the lowest drain read current and the highest threshold voltage.

Figure 2:
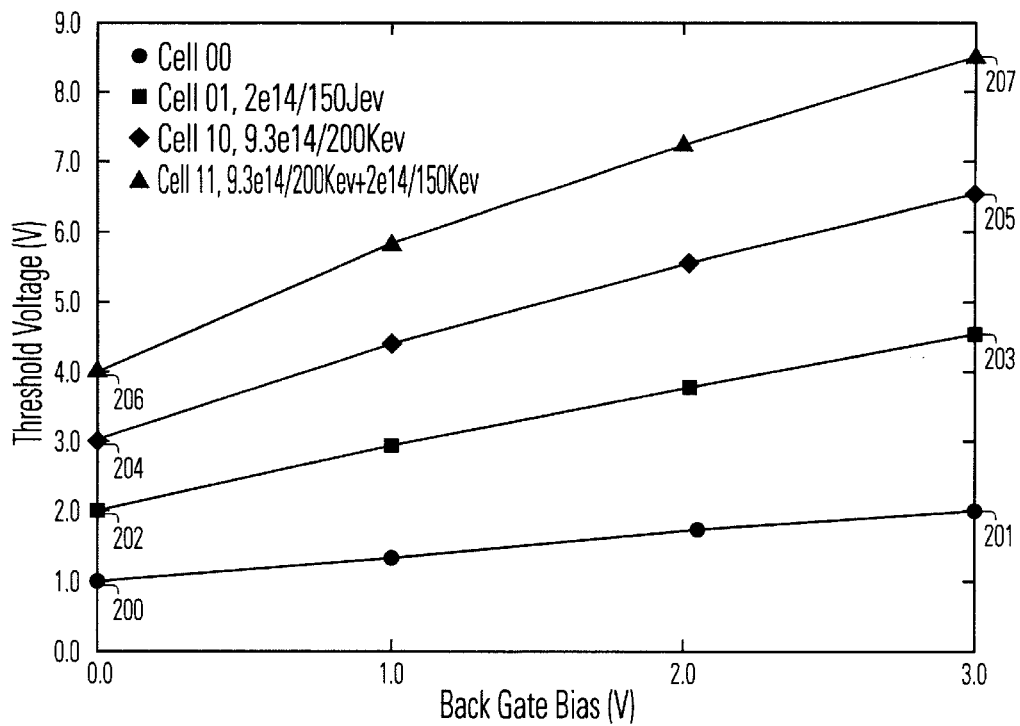
FIG. 2 is a graph showing the back gate bias versus the threshold voltage for one embodiment of the invention.
Figure 3:
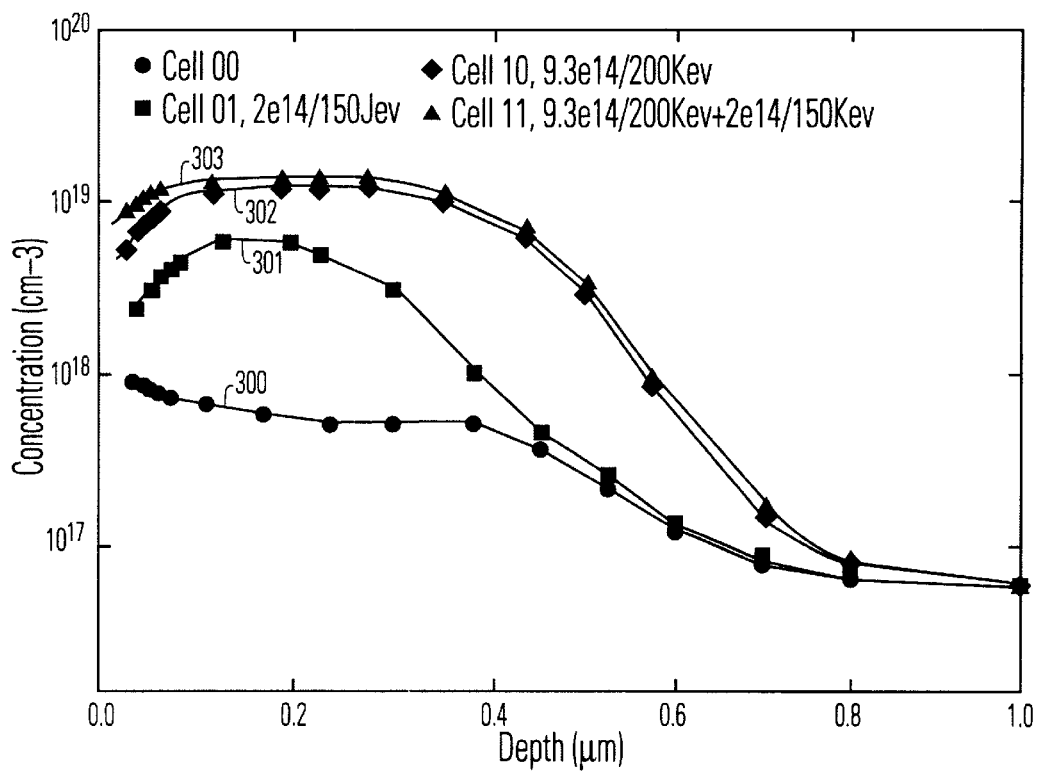
FIG. 3 is a graph showing the vertical doping profile data for one embodiment of the invention.

FIGS. 2 and 3 provide example threshold voltage data and vertical doping profile data for a two-bit level mask n-channel ROM array implemented according to the invention. FIG. 2 illustrates the effect on threshold voltages of the two-bit level mask ROM. In particular, four cells are implemented.

The first cell, cell 00, has no code implant, and is the initial low threshold voltage cell. The initial threshold voltage for this cell at zero back bias is shown at point 200, and as a back gate bias increases, to 1 volt up to 3 volts by corresponding negative channel bias, the threshold increases to point 201.

The second cell, cell 01, has a single shallow code implant at $2 \times 10^{14}$ cm$^{-2}$ concentration with a 150 KeV implant energy of boron ions. The initial threshold for this cell with zero back bias is shown at point 202. With a back bias of 3 volts, the threshold voltage has increased to point 203.

The third cell, cell 10, has a single deep code implant of $9.3 \times 10^{14}$ cm$^{-2}$ concentration with a 200 KeV implant energy of boron ions. The initial threshold for this cell with zero back bias is shown at point 204. With a back bias of 3 volts, the threshold voltage has increased to point 205.

The last cell, cell 11, has a combination of the shallow code implant and the deep code implant. The initial threshold for this cell with zero back bias is shown at point 206. With a back bias of 3 volts, the threshold voltage has increased to point 207. As can be seen in FIG. 2, excellent level-to-level differences are obtained for the four types of cells. The effects of the back gate bias on the four level mask ROM cells are also apparent. By applying a 2 volt back gate bias, the level-to-level difference is amplified from less than 1 volt to about 2 volts per cell. The major reason for this shift in threshold is believed to be the bulk doping profiles of the two-bit level mask ROM cells modulated by the implantation.

The doping profiles are shown in FIG. 3 for the ion implantation combination used in the two-bit memory cell array example illustrated in FIG. 2. For cell 00, the vertical doping profile is shown on trace 300. For cell 01, the vertical doping profile is shown on trace 301. For cell 10, the vertical doping profile is shown on trace 302. For cell 11, the vertical doping profile is shown on trace 303. The higher surface doping concentration of cell 11 leads to a higher threshold voltage a zero back gate bias. Also, the differences in surface doping concentration have a significant impact on the body effect in such cells. Therefore, the back gate bias generates greater level-to-level differences for the four types of cells.

Thus by adjusting the ion implantation dosage and energy, a four level mask ROM cell can be implemented using only two masks. In addition, by applying back gate bias, the noise margin is increased because of the different amount of body effect encountered for the four types of cells.

Table 2 lists the multiple bits per cell when n=3, or combinations of three distinguishable code implants are directed into selected cell channels. According to our postulated relationship, for three code implants (n=3), the number of cell types is $2^n=2^3=8$. As seen in Table 2, our postulated relationship holds true for n=3.

For the example shown in Table 2, eight types of memory cells are provided by combining the three code implants with the first channel implant. The combinations are incorporated into a three-bit level memory array. For some embodiments of the invention, the first code implant has a smaller projected range than the second code implant and the third code implants. The second code implant has a larger number of implanted ions than the third code implant. The second code implant has the same projected range as the third code implant. A first memory cell type 000 has only the first channel implant, i.e., it has no additional code implant. A second memory cell type 001 has an additional first code implant. A third memory cell type 010 has an additional second code implant. A fourth memory cell type 011 has an additional third code implant. A fifth memory cell type 100 has an additional first code implant and an additional second code implant. A sixth memory cell type 101 has an additional first code implant and an additional third code implant. A seventh memory cell type 110 has an additional second code implant and an additional third implant. An eighth memory cell type 111 set has an additional first code implant, an additional second code implant, and an additional third code implant.

Further analysis shows that the S=2$^n$ relationship holds for any multilevel memory array, where n is a positive integer. Therefore, because the use of asymmetric cells dramatically reduces drain current read errors in a memory array, the increased density advantage of multilevel memory cells is most severely limited by the dimensional limits imposed by ion implantation processes for code implants.

TABLE 2

| First Channel Implant | First Code Implant | Second Code Implant | Third Code Implant | Cell Type |
|---|---|---|---|---|
| Y | N | N | N | 000 |
| Y | Y | N | N | 001 |
| Y | N | Y | N | 010 |
| Y | N | N | Y | 011 |
| Y | Y | Y | N | 100 |
| Y | Y | N | Y | 101 |
| Y | N | Y | Y | 110 |
| Y | Y | Y | Y | 111 |
| Three-bit Level Cell | Number of Code Implants = 3 = n | | | Number of Cell Types = 2$^n$ = 8 |

Figure 4:
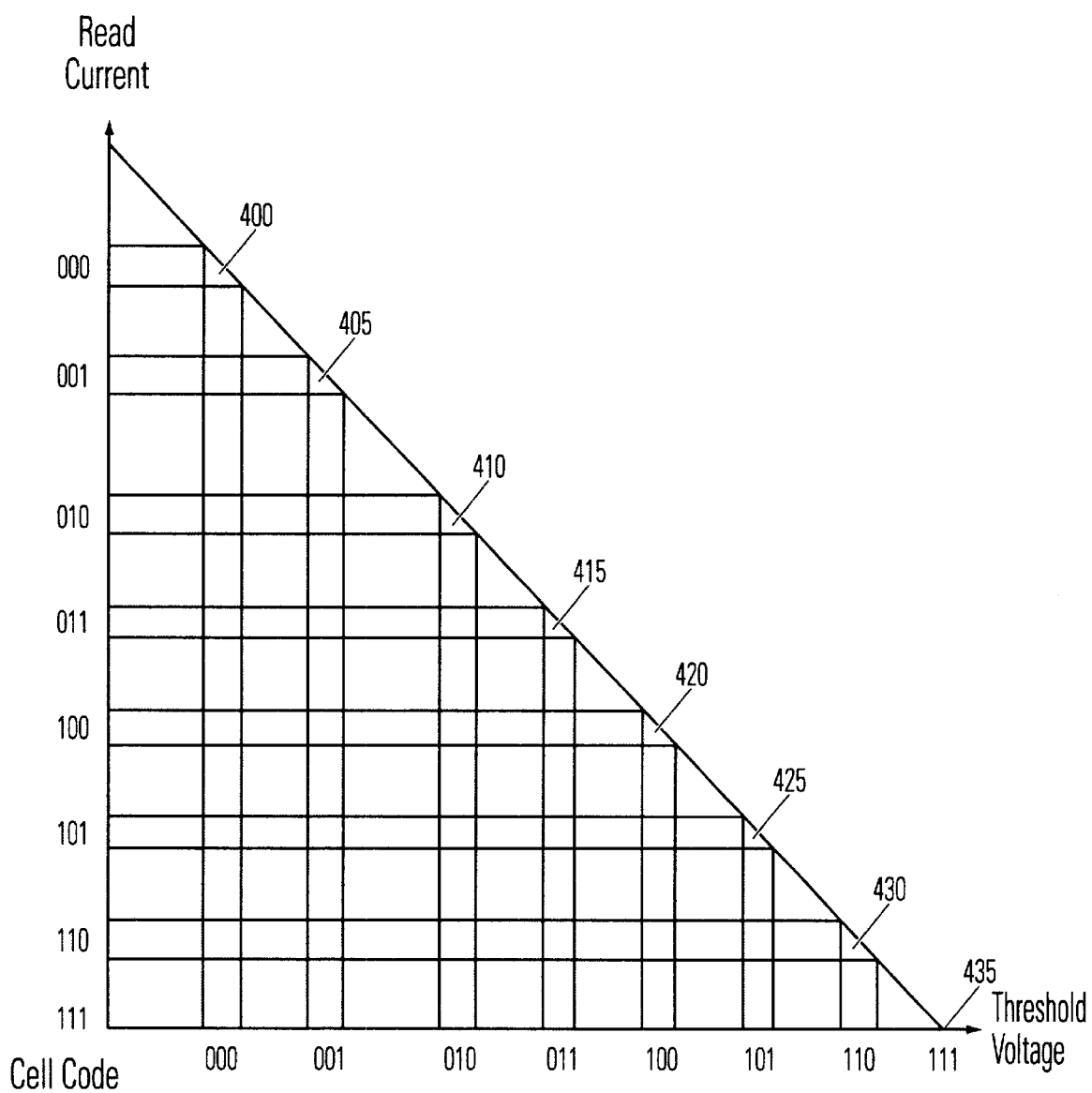
FIG. 4 is a graph illustrating the relationship between the drain read current and the threshold voltage for a three-bit level memory cell with eight different codes.

The graph in FIG. 4 illustrates the relationship between the drain read current and the threshold voltage for the 8 different cell types in a three-bit level memory cell array, i.e., with a selection group comprising eight different bit codes. In this example, each type of cell is distinguished from a different type of cell by its drain read current for a given voltage. As shown in FIG. 4, 000 cell current/voltage characteristics 400 comprise the highest drain read current and the lowest threshold voltage. Also for the three-bit level memory cell array 111 cell current/voltage characteristics 435 comprise the lowest drain read current and the highest threshold voltage.

Asymmetric Memory Cell

Figure 5:
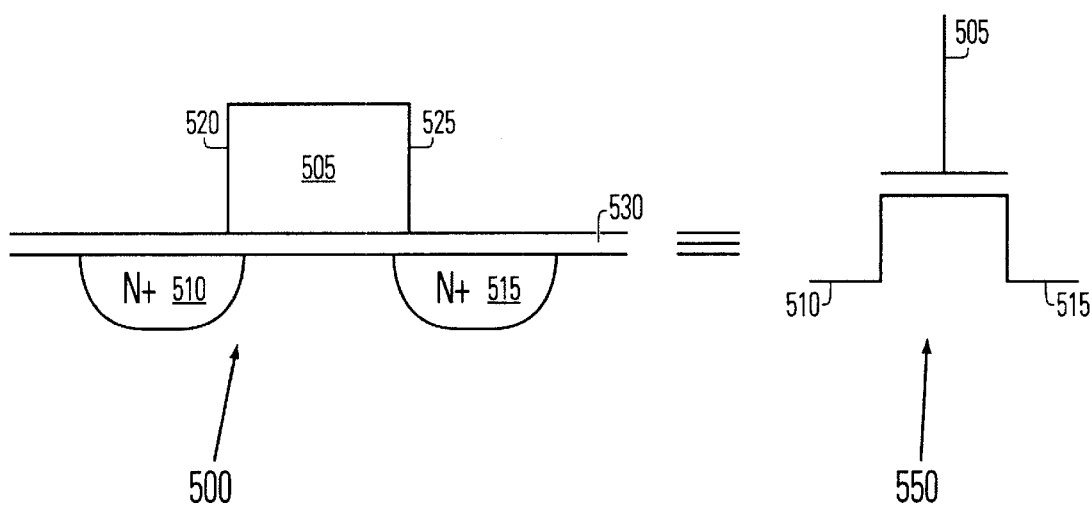
FIG. 5 provides a schematic representation of the cross section of a prior art symmetric memory cell found in the prior art.

FIG. 5 provides a schematic representation of a symmetric memory cell cross section 500 found in the prior art. FIG. 5 also shows the equivalent electronic circuit symbol used to represent the symmetric cell in FIG. 14 and FIG. 15 below. The symmetric memory cell 500 comprises a gate 505, a conventional drain 510, and a source 515. The gate has a first side 520 and a second side 525. The gate 505 is disposed above the gate oxide 530. The conventional drain 510 is disposed on the first side 520 of the gate and below the gate oxide 530. The source 515 is disposed on the second side 525 of the gate and below the gate oxide 530. FIG. 5 also shows the conventional symmetric memory cell electronic circuit symbol 550.

Figure 6:
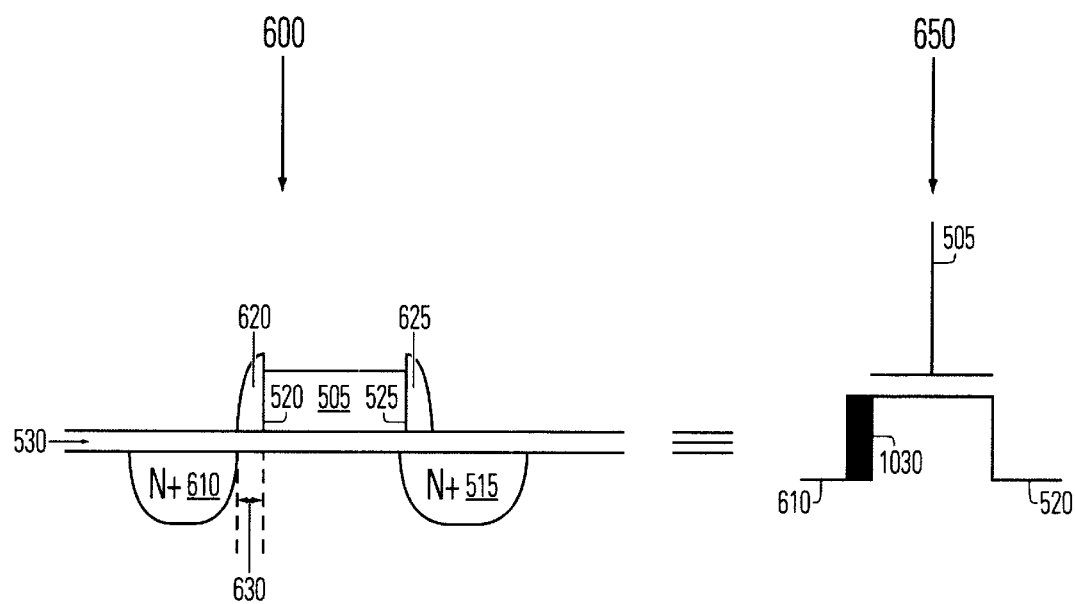
FIG. 6 provides a schematic representation of the cross section of an asymmetric memory cell of one embodiment of the invention.

FIG. 6 provides a schematic representation of the cross section of an asymmetric multilevel memory cell 600 of one embodiment of the invention. FIG. 6 also shows the equivalent electronic circuit symbol used for the asymmetric cell in FIG. 15 below. The asymmetric multilevel memory cell 600 comprises a gate 505, an asymmetric drain 610, and a source 515. The gate has a first side 520 and a second side 525. The gate 505 is disposed above a gate oxide 530. The gate oxide has a top.

The asymmetric drain 610 is disposed on the first side 520 of the gate 505 and below the gate oxide 530. The source 515 is disposed on the second side 525 of the gate 505 and below the gate oxide 530.

A first spacer 620 is disposed above the gate oxide 530 and next to the first side 520 of the gate 505. The first spacer 620 has a first spacer width at the top of the gate oxide 530. For some embodiments, a second spacer 625 is disposed above the gate oxide 530 and next to the second side 525 of the gate 505.

For some embodiments of the invention, the first spacer 620 width is in a range from 0.05 micrometers to 0.20 micrometers. One embodiment of the invention has a first spacer width of 0.12 micrometers.

The asymmetric drain 610 of the asymmetric multilevel memory cell 600 is laterally separated from the gate 505 by an offset 630. FIG. 6 also shows an asymmetric multilevel memory cell 600 electronic circuit symbol 650. The shaded region to the left of the gate represents the offset region 1030 formed between the asymmetric drain 610 and the channel 1020, and discussed below with reference to FIG. 10.

Method for Forming Asymmetric Multilevel Cells

Figure 7:
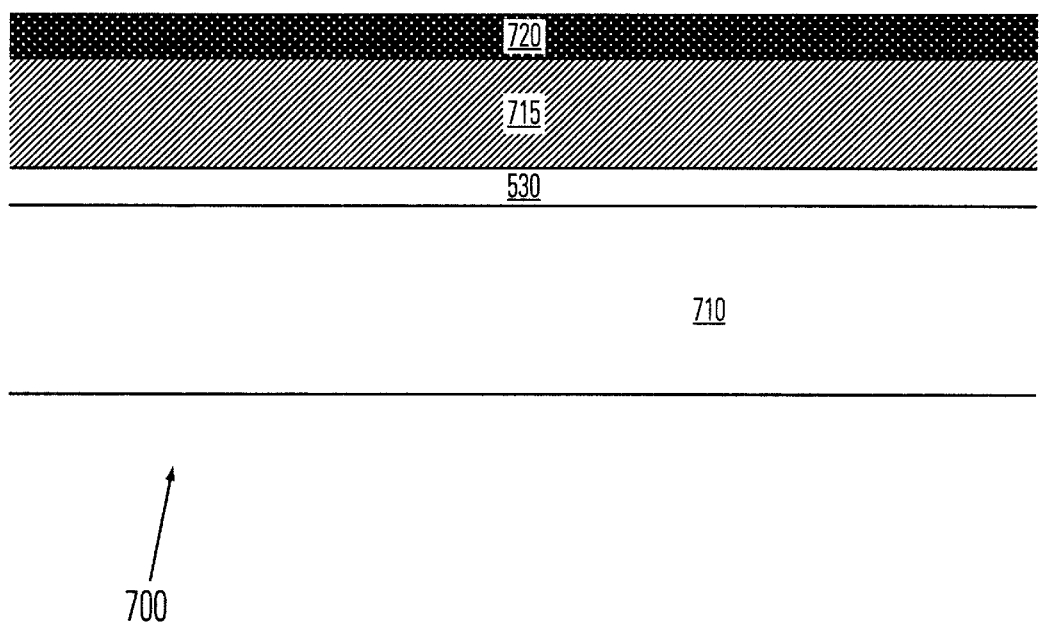
FIG. 7 is a cross section showing the memory cell fabrication layers after deposition of a gate oxide, a first conductive layer and a first dielectric layer for one of the second group of embodiments of the invention.

The first group of embodiments of the invention comprise methods to form an asymmetric multilevel memory cell. The key process steps after threshold voltage adjustment of the memory cell channel and gate oxide formation are discussed below. FIG. 7 is a first cross section of the asymmetric multilevel memory cell fabrication layers 700 for one of the first group of embodiments of the invention after deposition of an as-deposited gate masking layer 720. FIG. 7 shows the memory cell fabrication layers after deposition of the gate oxide 530 on a substrate material 710. Also shown are an as-deposited first conductive layer 715 which is used to form the gate 505, and a first stage of an as-deposited gate masking layer 720. The first stage of the as-deposited gate masking layer 720 is generally a dielectric, silicon nitride has been successfully used as the first stage of the as-deposited gate masking layer 720 material.

Figure 8:
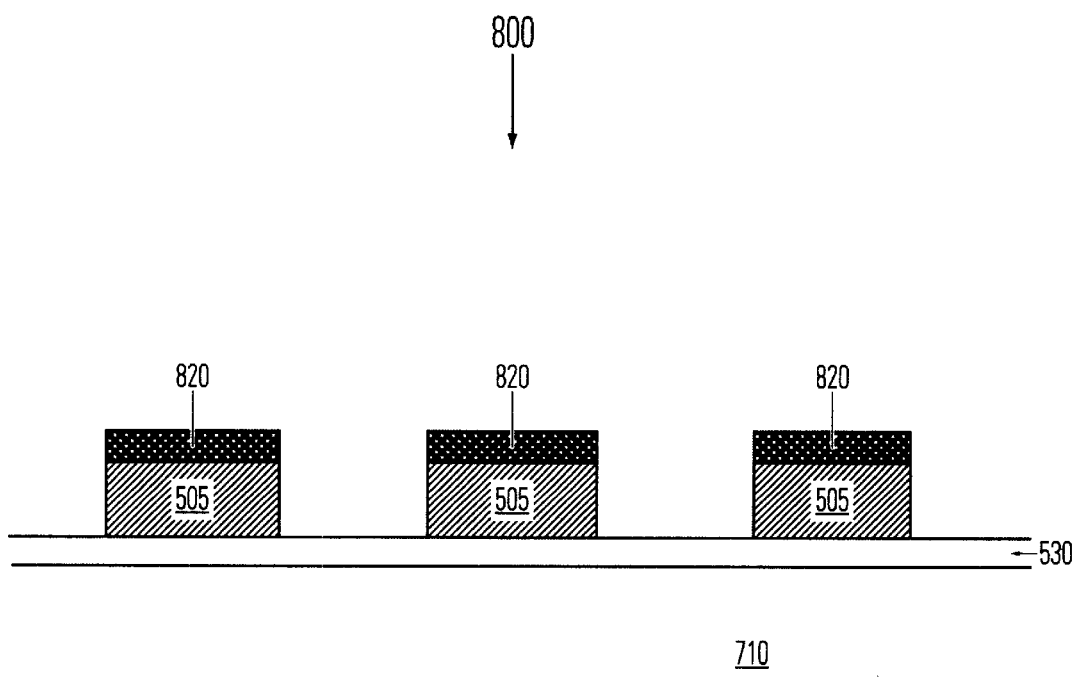
FIG. 8 is a cross section showing the memory cell fabrication layers after patterning of the first conductive layer for one embodiment of the invention.

FIG. 8 is a second cross section of the asymmetric multilevel memory cell fabrication layers 800 for one of the first group of embodiments of the invention after the gate 505 pattern has been formed using a bit line mask. The as-deposited gate masking layer 720 is patterned in the same configuration as the gate 505 to form a patterned gate masking layer 820 over showing the patterned gate 505.

Figure 9:
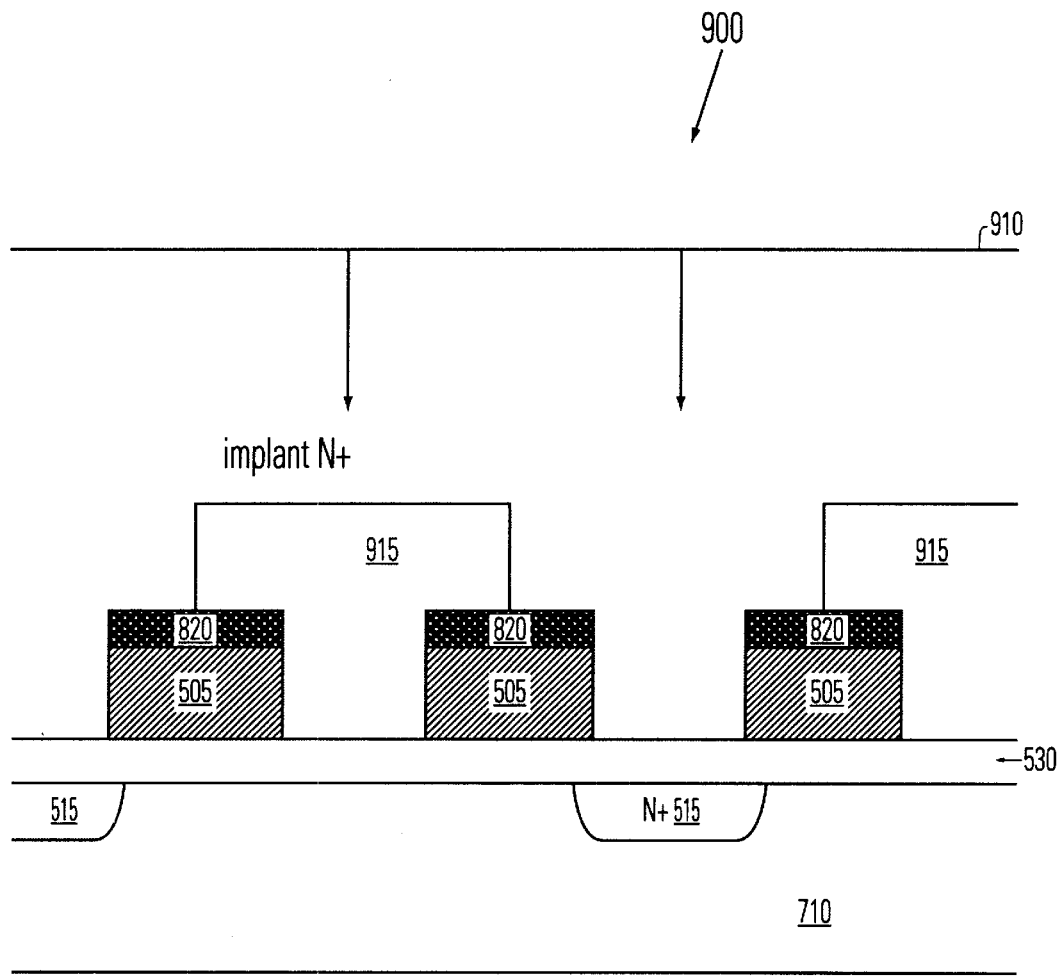
FIG. 9 is a cross section showing the source implantation and the memory cell fabrication layers for one embodiment of the invention.

FIG. 9 is a third cross section of the asymmetric multilevel memory cell fabrication layers 900 for one of the first group of embodiments of the invention showing a first implant 910. A drain photoresist mask 915 is patterned over the drain regions of the substrate 710 and a portion of each patterned gate masking layer 820 laterally adjacent to the drain region. Therefore, the drain regions of the substrate 710 of the memory cells receive only a very small dopant dosage from the first implant 910. The first implant 910 directs a dose of dopant ions into the source 515 regions of each asymmetric multilevel memory cell 600 because the source 515 regions are not covered by the drain photoresist mask 915. The dopant dosage placed into the gate 505 from the first implant 910 is very low because the patterned gate masking layer 820 absorbs most of the implant ions that would otherwise be directed at the gate 505. The first implant 910 is aligned with the gate 505. Note that the first implant 910 is performed using an asymmetric mask and is performed prior to formation of the first spacer 620.

Figure 10:
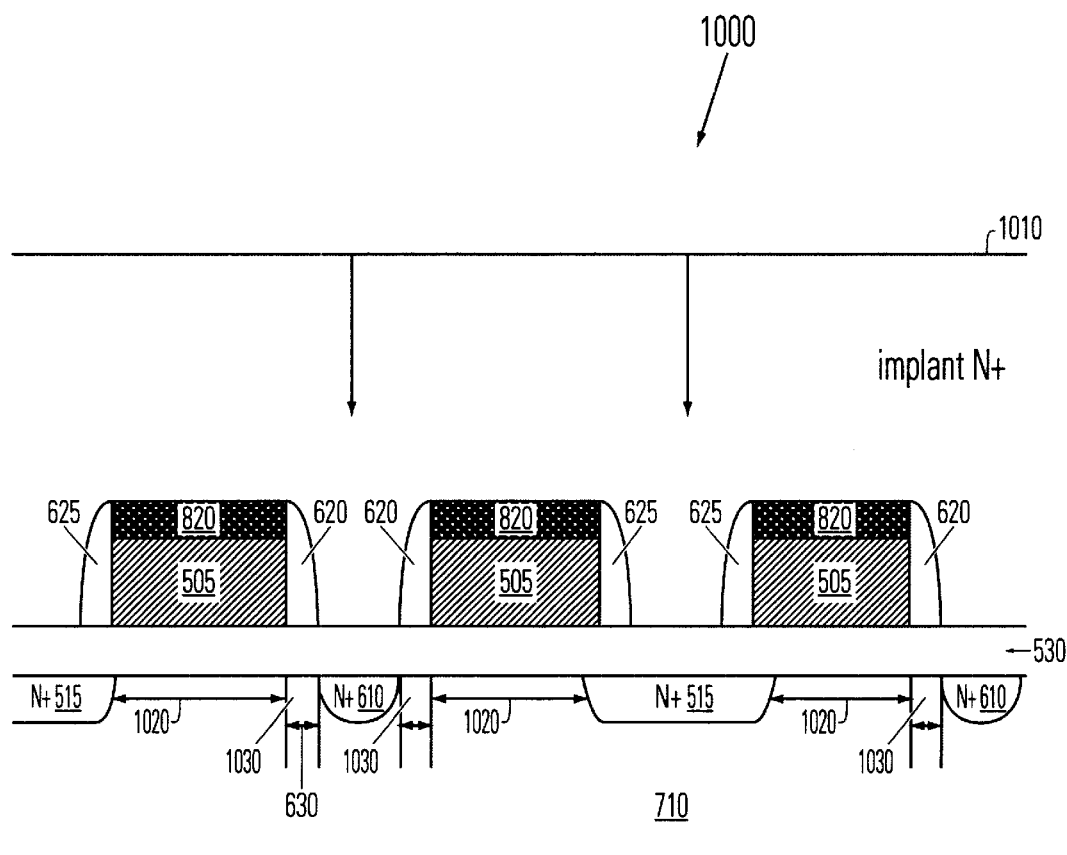
FIG. 10 is a cross section showing the memory cell layers of one embodiment of the invention with spacers on both sides of the gate. The drain implantation is also shown.

FIG. 10 is a fourth cross section of the asymmetric multilevel memory cell fabrication layers 1000 showing the memory cell layers of one embodiment of the invention with spacers on both sides of the gate. A second implant 1010 is also shown in FIG. 10.

The drain photoresist mask 915 is removed prior to the second implant 1010. The first spacer 620 is formed prior to the second implant 1010. The first spacer 620 is typically made of silicon dioxide but could be made of any dielectric material. The first spacer 620 extends upwards from the gate oxide 530 to the top of the patterned gate masking layer 820. The second implant 1010 is directed into the asymmetric drain 610 of each asymmetric multilevel memory cell 600. For some embodiments, the second implant 1010 is directed only to the asymmetric drain 610. For other embodiments as shown in FIG. 10, the second implant is directed at both the asymmetric drain 610 and the source 515 of each asymmetric multilevel memory cell 600. The second implant 1010 is aligned with the first spacer 620.

In some embodiments as shown in FIG. 10, a second spacer 625 is provided next to the second side 525 of the gate 505. For embodiments having the second spacer 625, the second spacer 625 is formed at the same time as the first spacer 620, i.e., prior to the second implant 1010. For these embodiments, the second implant 1010 is directed at both the asymmetric drain 610 and the source 515 of the asymmetric multilevel memory cell 600.

In some embodiments, the first spacer 620 (and also the second spacer 625 for embodiments having the second spacer 625) comprises an oxide formed by deposition processes using tetraethyl orthosilicate (TEOS). The first spacer 620 (and also the second spacer 625, for embodiments having the second spacer 625) is then patterned using a wet etch process. For embodiments having a second spacer 625, the second spacer 625 is formed at the same time and by the same processes as the first spacer 620.

A channel 1020 in the substrate 710 is disposed proximal to the gate oxide 530 and aligned with the gate 505. The channel 1020 extends from source 515 towards the asymmetric drain 610. The channel 1020 does not extend all the way to the asymmetric drain 610. Instead, an offset region 1030 in the substrate is disposed between the channel 1020 and the asymmetric drain 610. The offset region 1030 is also proximal to the gate oxide 530. The offset region 1030 is a key feature of the invention asymmetric multilevel memory cell 600.

The second implant 1010 is directed towards an exposed asymmetric drain 610 surface. The exposed asymmetric drain 610 surface has a width defined by the area of the top of the gate oxide 530 that remains uncovered by the first spacer 620 disposed next to the asymmetric drain 610.

For some embodiments, the second implant is directed at both the source 515 and the asymmetric drain 610.

The ultimate placement of the second implant 1010 dopants extends laterally outward from the region of the asymmetric drain 610 at which the second implant 1010 is directed. Therefore, the first spacer 620 width is greater than the offset 630. For some of the embodiments of the invention, the offset is greater than fifty percent (50%) of the first spacer 620 width. For the embodiments of the invention having a first spacer 620 width in a range from 0.05 micrometers to 0.20 micrometers, the offset 630 would be in a range from 0.02 micrometers to 0.20 micrometers. The offset region 1030 is adapted to inhibit source current as discussed in the Multilevel Memory Cell with Inhibited Source Current section below.

The first spacer 620 ensures that the offset region 1030 does not receive a large dosage of dopants from the second implant 1010. The second spacer 625 is not used for some embodiments of the invention because the second spacer 625 does not affect the offset region 1030. However, the second spacer 625 provides symmetry about the gate 505 and simplifies processing, and is therefore used for other embodiments of the invention, as shown in FIG. 10.

The second implant 1010 is not directed to regions of the source 515 proximal to either side of the source 515. Ions from the second implant 1010 are only directed to a central portion of the source 515 because the second spacer 625 absorbs the implant ions that would otherwise be directed to the side regions of the source. The second implant 1010 does not appreciably affect the gate 515 because the patterned gate masking layer 820 absorbs most of the implant ions that would otherwise be directed at the gate 515.

Figure 11:
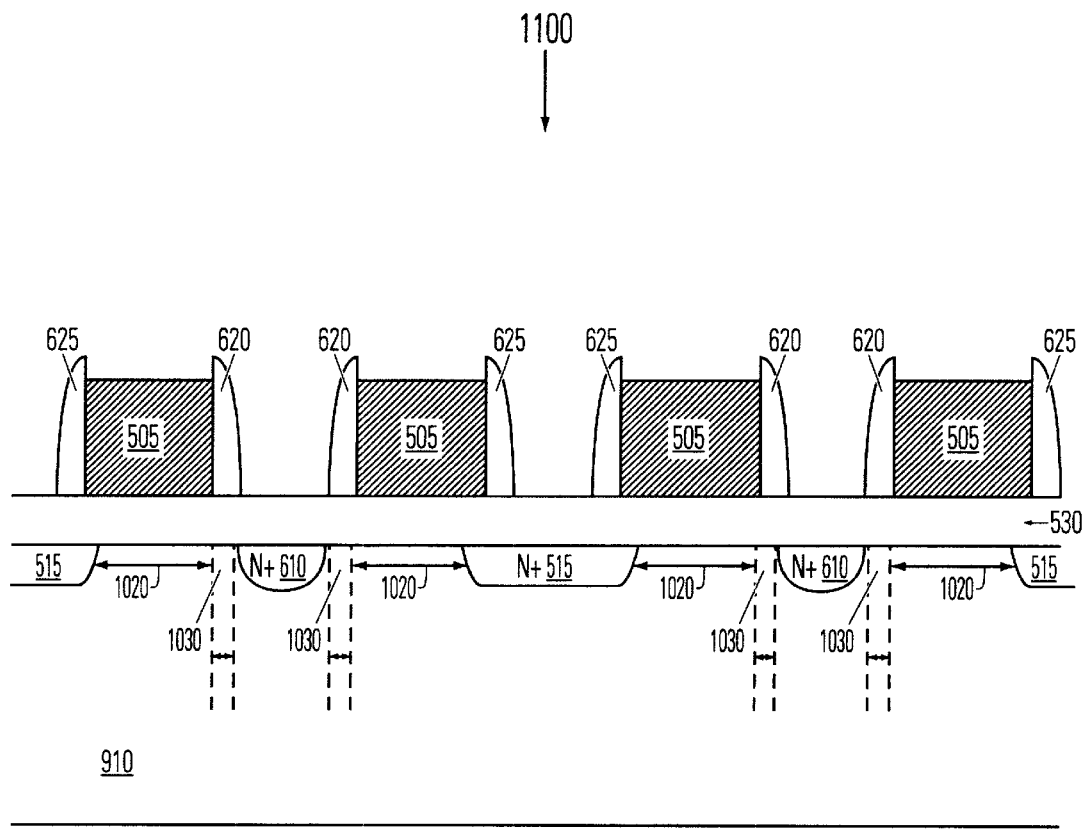
FIG. 11 is a cross section showing the memory cell fabrication layers after removal of the second stage gate masking layer for one embodiment of the invention.

FIG. 11 is a fifth cross section of the asymmetric multilevel memory cell fabrication layers 1100 for one embodiment of the invention showing the memory cell fabrication layers after removal of the patterned gate masking layer 820. The first spacer 620 and the second spacer 625 extend upwards beyond the top of the gate 505.

Figure 12:
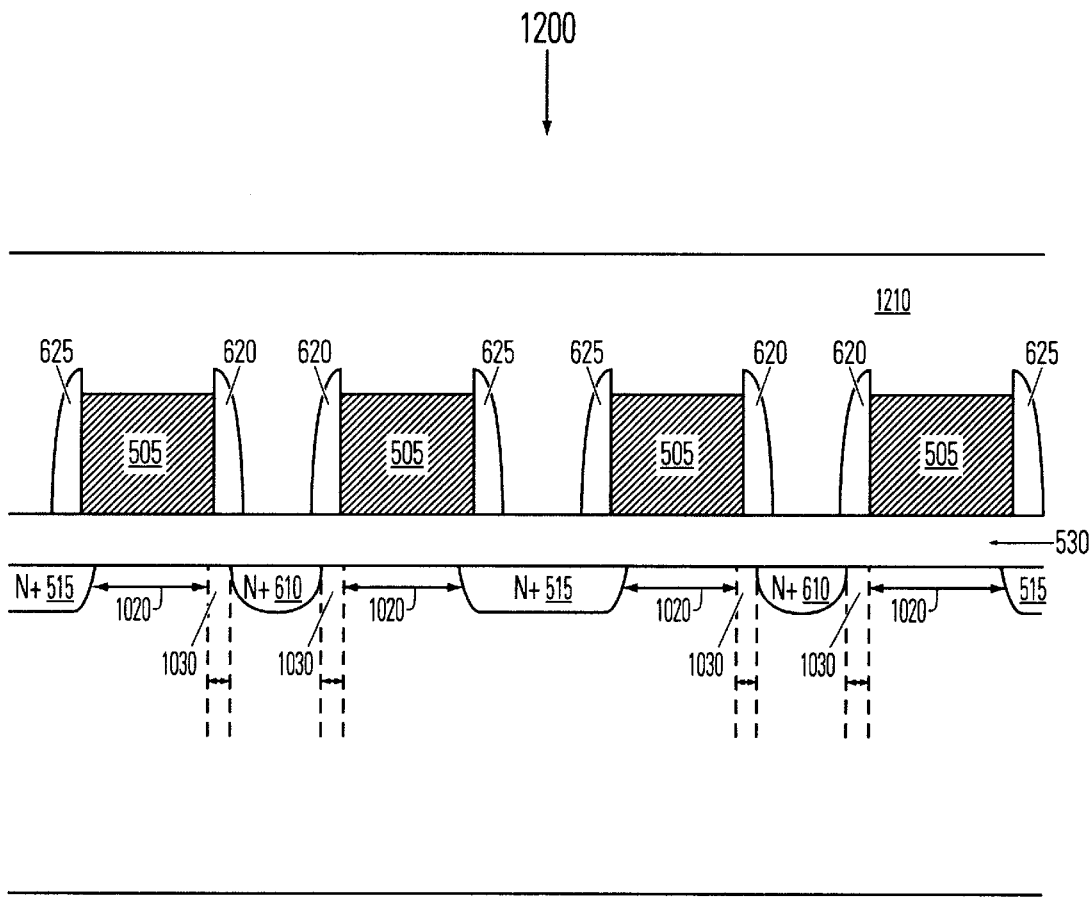
FIG. 12 is a cross section showing the memory cell fabrication layers after deposition of a second conductive layer for one embodiment of the invention.

FIG. 12 is a sixth cross section of the asymmetric multilevel memory cell fabrication layers 1200 for one embodiment of the invention showing the memory cell fabrication layers after deposition of a second conductive layer 1210. The second conductive layer 1210 is then patterned to form word lines in the memory array.

Multilevel Memory Cell with Inhibited Source Current

One key advantage provided by the asymmetric multilevel memory cell 600 is that the source 515 read current is inhibited so that the asymmetric multilevel memory cell 600 can only be read in one direction. For some embodiments of the invention, the asymmetric multilevel (MOS) memory cell 600 is an enhancement mode transistor and is normally off.

The asymmetric multilevel memory cells 600 are disposed in an integrated circuit. Each asymmetric multilevel memory cell 600 conforms to the limitations discussed above in the Asymmetric Memory Cell section of this specification.

The gate 505 has a first gate voltage, which is a positive potential for an NMOS cell. The gate oxide 530 acts as a dielectric, limiting carrier flow between the channel 1020 and the gate 505. The high potential of the gate 505 causes electrons in the channel 1020 to flow towards the gate oxide 530. Collection of these electrons near the channel 1020/gate oxide 530 interface forms a depletion region in the channel 1020, in which the channel 1020 electron concentration proximal to the gate oxide 530 becomes high enough to efficiently conduct electrons across the channel 1020.

Because the gate 505 extends over the source 515 and the channel 1020 is aligned with the gate 505, the channel 1020 extends all the way into the source 515. The asymmetric drain 610, however, is laterally spaced from the first side 520 of the gate 505 by the offset 630. Therefore, the side of the channel 1020 corresponding to the first side 520 of the gate 505 is also laterally spaced from the asymmetric drain 610 by the offset 630.

The region of the substrate 710 proximal to the gate oxide 530 and disposed between the channel 1020 and the asymmetric drain 610 is the offset region 1030. The offset region 1030 has an initial conduction state based on carrier concentration in the p-type substrate 710 as supplemented by the low dose threshold voltage implant. The offset region 1030 is disposed to the first side 520 of the gate 505.

The offset region 1030 cannot be controlled by the gate voltage because the gate 505 is not disposed over the offset region 1030. The gate voltage does not attract sufficient numbers of electrons to the offset region 1030 to form a depletion layer in the offset region 1030. Another way of describing offset region 1030 is that in the offset region 1030 the channel 1020 "disappears". The offset region 1030 is thereby adapted to maintain its initial conduction state in response to the gate voltage. Without the application of an electrical potential in addition to the gate voltage, electric current will be inhibited across the offset region 1030 and the asymmetric multilevel memory cell 600 will remain nonconducting.

Figure 13:
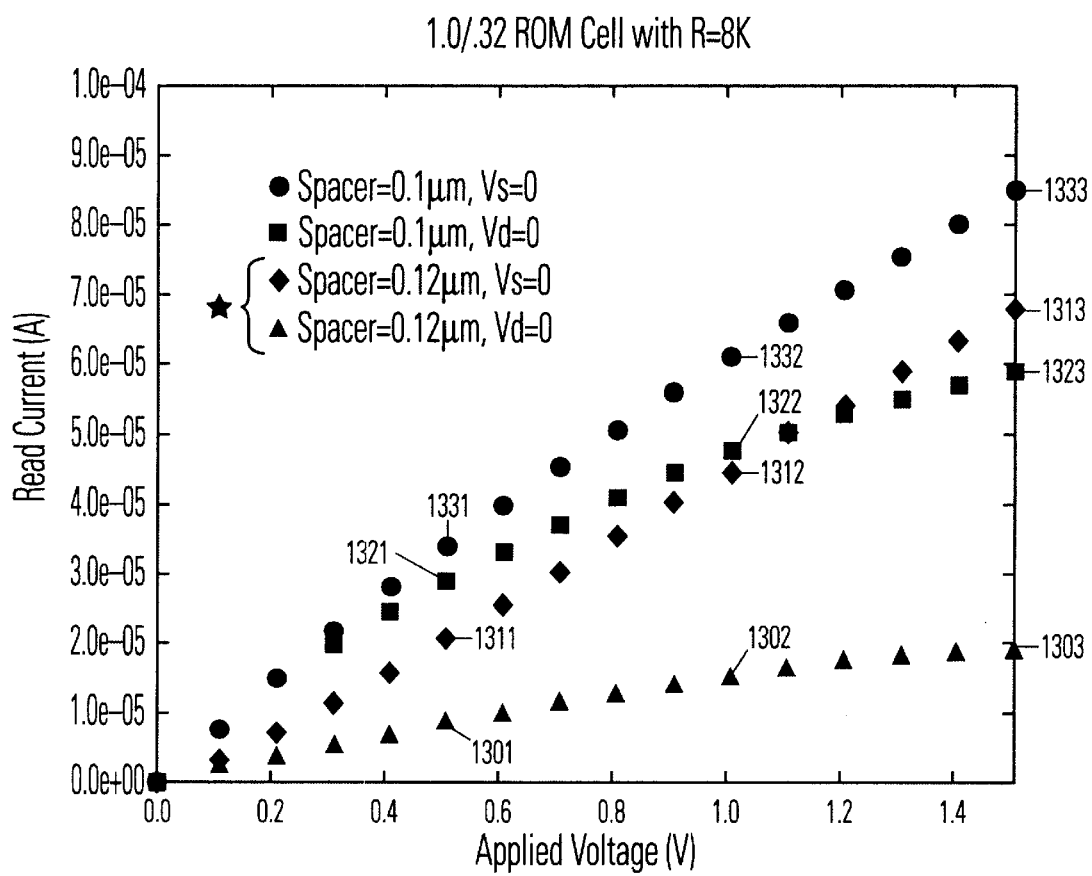
FIG. 13 is a graph showing the current-voltage curves of an asymmetric memory cell of one embodiment of the invention with different offset (spacer) dimensions.

FIG. 13 is a graph showing the current-voltage curves for an asymmetric multilevel memory cells 600 of one embodiment of the invention. The curves are provided for asymmetric multilevel memory cells 600 with first spacer 620 and second spacer 625 widths at the top of the gate oxide 530 ranging from 0.10 micrometers to 0.12 micrometers. The values correspond to an asymmetric multilevel memory cell 600 width of 1.0 micrometers and an asymmetric multilevel memory cell 600 length of 0.32 micrometers. The bit line loading effect for the asymmetric multilevel memory cells 600 represented in FIG. 13 is 8 kilohms.

As discussed above, the asymmetric multilevel memory cell 600 is adapted to inhibit source read current. This inhibition can be measured by comparing the drain read current of the asymmetric multilevel memory cell 600 at a drain voltage (with the source voltage at zero) versus the source read current of the asymmetric multilevel memory cell 600 at a source voltage (with the drain voltage at zero), or $I_{(Vs=0)}/I_{(Vd=0)}$. The $I_{(Vs=0)}/I_{(Vd=0)}$ ratio also serves as a measure of the freedom from cell type misread for a particular cell. The freedom from cell type misreads improves as the measure increases in value, but is dependent on a number of other factors, such as the current-voltage characteristics for each type of cell in the memory array, and the threshold voltage difference between each type of cell. The closer, in terms of current-voltage characteristics (or threshold voltage), that one type of asymmetric multilevel memory cell 600 is to another type of asymmetric multilevel memory cell 600 in the same array the higher the $I_{(Vs=0)}/I_{(Vd=0)}$ ratio must be to ensure that the asymmetric multilevel memory cells 600 are properly read.

For an asymmetric multilevel memory cell 600 with a 0.12 micrometer spacer, FIG. 13 shows that the source read current is approximately 9 microamps for a source voltage of 0.5 volts 1301. The drain read current is approximately 20 microamps for a drain voltage of 0.5 volts 1311. The $I_{(Vs=0)}/I_{(Vd=0)}$ ratio measure of freedom from cell type misread for this cell at 0.5 volts is approximately 2.22.

For an asymmetric multilevel memory cell 600 having a 0.12 micrometer first spacer 620 and a source voltage of 1.0 volt the source read current is approximately 16 microamps 1302. For a drain voltage of 1.0 volt the drain read current is approximately 45 microamps 1312. The $I_{(Vs=0)}/I_{(Vd=0)}$ ratio for this cell at 1.0 volt is approximately 2.81.

For an asymmetric multilevel memory cell 600 having a 0.12 micrometer first spacer 620 width and a source voltage of 1.5 volts the source read current is approximately 19 microamps 1303. For a drain voltage of 1.5 volts the drain read current is approximately 68 microamps 1313. The $I_{(Vs=0)}/I_{(Vd=0)}$ ratio for this cell at 1.5 volts is approximately 3.58. Therefore, for the 0.12 micrometer first spacer 620 width embodiment described by FIG. 13, the most accurate read currents will be obtained for higher drain voltages. The increase in accuracy with increase in drain voltage is clearly demonstrated by the data presented in FIG. 13 for drain voltages up to 1.5 volts.

For an asymmetric multilevel memory cell 600 with a 0.10 micrometer first spacer 620 width, FIG. 13 shows that the source read current is approximately 59 microamps for a source voltage of 1.5 volts 1323. The drain read current is approximately 85 microamps for a drain voltage of 1.5 volts 1331. The $I_{(Vs=0)}/I_{(Vd=0)}$ ratio measure of freedom from cell type misread for this cell at 1.5 volts is approximately 1.44. While this measure of improvement is not as large as the ratio obtained for the asymmetric multilevel memory cell 600 having a 0.12 micrometer first spacer 620 width, it should be noted that for smaller cell dimensions, smaller first spacer 620 widths will show marked reduction in cell type misreads. Based on the data for the 0.12 micrometer first spacer 620 widths and projections regarding cell size, the asymmetric cells are expected to effectively reduce cell type misreads for first spacer 620 widths ranging from 0.05 micrometers to 0.20 micrometers.

When a drain voltage of sufficient magnitude is applied to the asymmetric multilevel memory cell 600, electrons flow from the substrate 710 and the channel 1020 to the offset region 1030 until the a depletion region is established in the offset region 1030 and the cell conducts electrons through the offset region 1030 to the drain.

As shown by FIG. 13, a drain voltage of 1.5 volts for a 0.12 micrometer first spacer 620 width provides a drain read current of 68 microamps. This current indicates that a drain voltage of 1.5 volts is sufficient to establish a depletion region in the offset region 1030. The source read current for a source voltage of 1.5 volts and a first spacer 620 width of 0.12 micrometers is 19 microamps, i.e., much less than the comparable 68 microamps drain read current. The low source read current demonstrates that the offset region 1030 is adapted to maintain the offset region's initial conduction state (i.e., enhancement mode-off) in response to a source voltage of 1.5 volts.

Integrated Circuit With Source Current Inhibited Memory Cells

Figure 15:
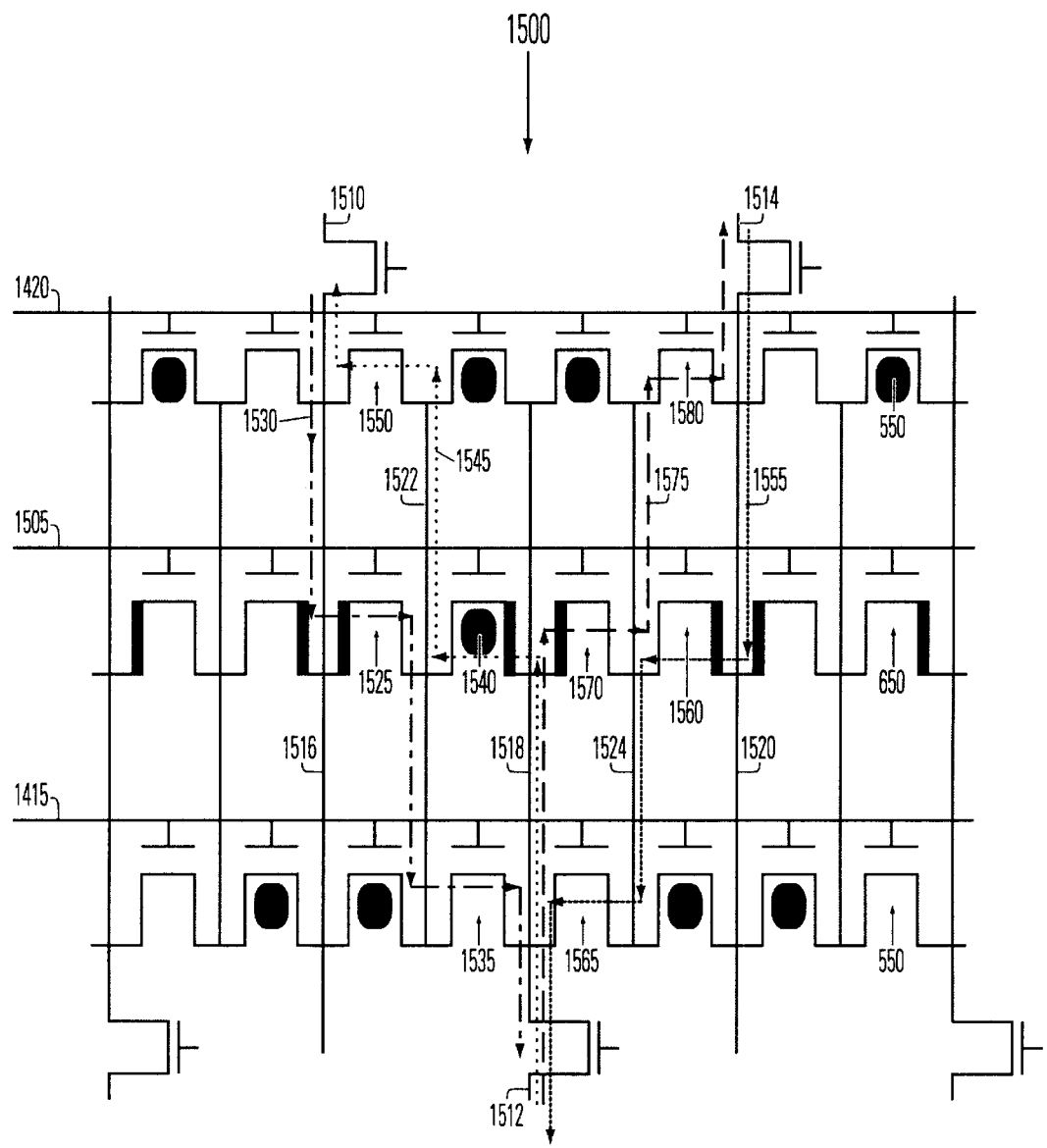
FIG. 15 is a schematic illustrating a memory cell array structure for an array comprising asymmetric multilevel cells.

The third group of embodiments of the invention provide an integrated circuit comprising an array of memory cells. The memory cell array comprises asymmetric (source current inhibited) multilevel cells 1500, and as shown in FIG. 15, is arranged so that neighboring cells share a common source. In this arrangement, the asymmetric drain current read of a memory cell will be much more accurate than for a memory array comprising symmetric memory cells 500, because the source current of the neighboring asymmetric multilevel memory cell 600 will be much lower than the asymmetric drain current of the cell being read, as discussed above with respect to FIG. 13 in the Multilevel Memory Cell with Inhibited Source Current section. The integrated circuits provided by these embodiments typically comprise a plurality of interconnected memory cell arrays having asymmetric multilevel cells 1500.

The memory cell array comprises memory cells. The memory cells comprise transistors having channels in channel regions of a substrate. Selected asymmetric multilevel memory cells in the memory array store multiple bits.

Figure 14:
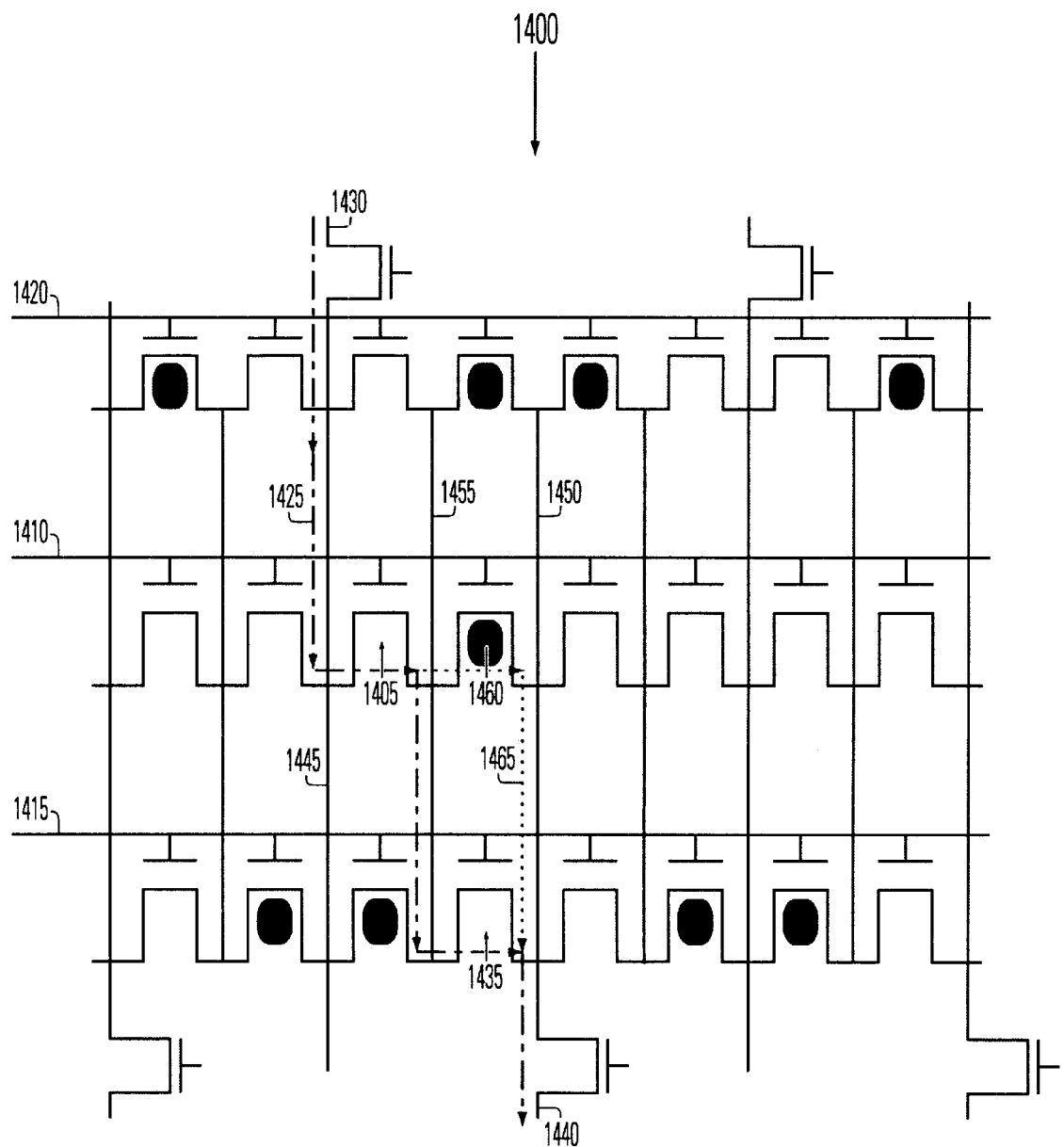
FIG. 14 is a schematic illustrating a memory cell array structure using prior art symmetric memory cells.

The memory cell array further comprises a word line and a bit line. The word line and the bit line are coupled respectively with rows and columns of memory cells in the array. Applying voltages to the rows and columns of the array provides a means for reading data stored in the array. The bit line comprises a first patterned layer of the integrated circuit. The word line comprises a second patterned layer of the integrated circuit A memory array comprising prior art symmetric memory cells 1400 is shown in FIG. 14. FIG. 14 illustrates a single row of selectable memory cells disposed in the first word line 1410. A corresponding bank left select line 1415 is disposed below the first word line 1410, and a corresponding bank right select line 1420 is disposed above the first word line 1410. Each of the bank select lines is coupled to a row of transistors.

The memory array comprising prior art symmetric memory cells 1400 cannot consistently provide accurate symmetric drain read currents. For example, as shown in FIG. 14, if a first cell 1405 disposed on a first word line 1410 is read, the first word line 1410 and the bank left select line 1415 will be at a high potential, while the bank right select line 1420 will be at a low potential. A first current 1425 flows from the sense amplifier 1430 through the first cell 1405, through a second cell 1435, and to a ground 1440. The sense amplifier 1430 has a sense amplifier conductor 1445 that is in communication with the bank select left line 1415, the bank select right line 1420, and the first word line 1410. The sense amplifier conductor 1445 has a first side (the left side in FIG. 14) and a second side (the right side in FIG. 14).

The ground 1440 has a ground conductor 1450 that is in communication with the bank select left line 1415, the bank select right line 1420, and the first word line 1410. The ground conductor 1450 has a first side and a second side.

A first bit line 1455 is disposed proximal to the ground conductor 1450 and on the first side of the ground conductor 1450. The first bit line 1455 is also disposed proximal to the sense amplifier conductor 1445 and on the second side of sense amplifier conductor 1445. The first cell 1405 is disposed between the sense amplifier conductor 1445 and the first bit line 1455. The second cell 1435 is disposed on the bank select left line 1415 and is also disposed between the first bit line 1455 and the ground conductor 1450.

A third cell 1460 is disposed on the first word line 1410 between the first bit line 1455 and the ground conductor 1450. The third cell 1460 provides a first alternative current 1465 path between the first cell 1405 and the ground 1440, which bypasses the second cell 1435. If the third cell 1460 is a low threshold voltage cell, then the read current of the first cell 1405 is likely to be misread so that the first cell 1405 is read as different, more conductive cell type.

The read current for the first cell 1405 is therefore strongly dependent on the threshold voltage of its neighbor cell, the third cell 1460. The relative values of the effective resistance of the third cell 1460 ($R_{1460}$) and the effective resistance of the second cell 1435 ($R_{1435}$) will determine how susceptible the first cell 1405 is to a cell type misread. The read current for the first cell 1405 will be proportional to $(R_{1435}+R_{1460})/(R_{1435} \times R_{1460})$. Unless $R_{1460}$ is much greater than $R_{1435}$, the third cell 1460, which is a symmetric cell, may lead to a cell type misread because $(R_{1435}+R_{1460})/(R_{1435} \times R_{1460})$ is less than $R_{1435}$.

For the two-bit memory array example discussed above a small resistance (low threshold voltage) third cell 1460 is likely to result in a misread of a less conductive first cell 1405 as a more conductive cell. For example, with reference to FIG. 1, a 11 cell could be misread as a 10 cell, 01 cell, or an 00 cell. Similarly, a 10 cell could be misread as a 01 cell or a 00 cell; or a 01 cell could be misread as a 00 cell.

FIG. 15 illustrates a memory array comprising asymmetric multilevel cells 1500, one of the third group of embodiments of the invention. The two-bit level memory cells disposed on the second word line 1505 are asymmetric multilevel memory cells 600.

The read current for each asymmetric multilevel memory cell 600 is accurately read in only one direction because current in an asymmetric multilevel memory cell 600 flows much more readily from the asymmetric drain 610 to the source 515, than from the source 515 to the asymmetric drain 610, as discussed above in the Multilevel Memory Cell with Inhibited Source Current section. The advantages source current inhibition provided by the asymmetric multilevel memory cell are particularly beneficial for memory arrays when the $I_{(Vs=0)}/I_{(Vd=0)}$ ratio is greater than 2.5, or $I_{(Vd=0)}$ is less than forty percent of $I_{(Vs=0)}$.

Unlike the symmetric memory cells 500 of a conventional memory array 1400, an accurate reading of each asymmetric multilevel memory cell 600 is provided when an asymmetric multilevel memory cell 600 is sensed from appropriate array terminal.

Five array terminals are shown in FIG. 15. Each of these terminals provides two functions. Depending upon which way the current flows to accurately read a selected memory cell, each associated terminal acts as either a ground or a sense amplifier. Three terminals of interest for this discussion comprise a first terminal 1510, a second terminal 1512, and a third terminal 1514. The first terminal 1510 has a first terminal conductor 1516, the second terminal 1512 has a second terminal conductor 1518, and the third terminal 1514 has a third terminal conductor 1520. Each of the terminal conductors has a first (left in FIG. 15) side and a second (right in FIG. 15) side. The second terminal conductor 1518 is disposed to the second side of the first terminal conductor 1516, and is also disposed on the first side of the third terminal conductor 1520. A second bit line 1522 is disposed between the first terminal conductor 1516 and the second terminal conductor 1518. A third bit line 1524 is disposed between the second terminal conductor 1518 and the third terminal conductor 1520.

A fourth cell 1525 is disposed on the second word line 1505 and is also disposed between the first terminal conductor 1516 and the second bit line 1522. In order to read the fourth cell 1525, the first terminal 1510 acts as a sense amplifier and the second terminal 1512 acts as ground. The fourth cell 1525 is accurately read when the second word line 1505 and the bank left select line 1415 are at a high potential, while the bank right select line 1420 is at a low potential. These potentials result in a second current 1530, from the first terminal 1510, through the fourth cell 1525, through a fifth cell 1535, and to the second terminal 1512. The fifth cell 1535 is disposed on the bank select left line 1415 and is also disposed between the second bit line 1522 and the second terminal conductor 1518.

A sixth cell 1540 is a neighbor of the fourth cell 1525 on the second word line 1505. The sixth cell is disposed between the second bit line 1522 and the second terminal conductor 1518. The sixth cell 1540 and the fourth cell 1525 share a common source 515. The current flow through the sixth cell 1540 to the second terminal 1512 is not large enough to cause a cell type misread. The,error is avoided because the source 515 to asymmetric drain 610 current for the sixth cell 1540 is much smaller than the asymmetric drain 610 to source 515 current for the fourth cell 1525, and substantial current would have to flow from the source 515 to the asymmetric drain 610 of the sixth cell 1525 to cause a cell type misread of the fourth cell 1525.

For example, an asymmetric multilevel memory cell 600 having a 0.12 micrometer offset, as described above in the Multilevel Memory Cell with inhibited Source Current section, would have an $I_{(Vs=0)}/I_{(Vd=0)}$ ratio at 1.5 volts of approximately 3.58. Therefore, even if the threshold voltage difference for different cell types in a memory array comprising asymmetric multilevel cells 1500 is only one-half of the voltage difference for cell types in a conventional memory array 1400, the probability of a cell type misread in the memory array comprising asymmetric multilevel cells 1500 would be only half of the probability of a cell type misread in the conventional memory array 1400.

A third current 1545 is required to accurately read the sixth cell 1540. The second terminal 1512 acts as a sense amplifier and the first terminal 1510 acts as ground. The third current 1545 flows in response to a high potential for both the bank right select line 1420 and the second word line 1505, and a low potential for the bank left select line 1415. The third current 1545 flows from the second terminal 1512, through the sixth cell 1540, through the seventh cell 1550, and to the first terminal 1510.

For the third current 1545, the situation is reversed from that of the second current 1530 with respect to the sixth cell 1540 and the fourth cell 1525. For the third current 1545, the fourth cell 1525 is a neighbor of the cell to be read, the sixth cell 1540. Both the sixth cell 1540 and the fourth cell 1525 are disposed on the second word line 1505. The fourth cell 1525 does not allow enough current to flow through to the first terminal 1510 to cause a cell type misread. The error is avoided because the source 515 to asymmetric drain 610 current for the fourth cell 1525 is much smaller than the asymmetric drain 610 to source 515 current of the sixth cell 1540, and substantial current would have to flow from the source 515 to the asymmetric drain 610 of the fourth cell 1525 to cause a cell type misread of the sixth cell 1540.

An eighth cell 1560 is disposed on the second word line 1505, and is also disposed between the third bit line 1524 and the third terminal conductor 1520. A fourth current 1555 is required to accurately read the eighth cell 1560. The third terminal 1514 acts as a sense amplifier and the second terminal 1512 acts as ground. The fourth current 1555 flows in response to a high potential for both the bank left select line 1415 and the second word line 1505, and a low potential for the bank right select line 1420. The fourth current 1555 flows from the third terminal 1514, through the eighth cell 1560, through a ninth cell 1565, and to the second terminal 1512. The ninth cell is disposed on the bank select left line 1415, and is also disposed between the second terminal conductor 1518 and the third bit line 1524.

A tenth cell 1570 is a neighbor of the eighth cell 1560 on the second word line 1505. The tenth cell 1570 is disposed between the third bit line 1524 and the second terminal conductor 1518. The tenth cell 1570 does not allow enough current to flow through to the second terminal 1512 to cause a cell type misread. The error is avoided because the source 515 to asymmetric drain 610 current for the tenth cell 1570 is much smaller than the asymmetric drain 610 to source 515 current of the eighth cell 1560, and substantial current would have to flow from the source 515 to the asymmetric drain 610 of the tenth cell 1570 to cause a cell type misread.

A fifth current 1575 is required to accurately read the tenth cell 1570, the second terminal 1512 acts as a sense amplifier and the third terminal 1514 acts as ground. The fifth current 1575 flows in response to a high potential for both the bank right select line 1420 and the second word line 1505, and a low potential for the bank left select line 1415. The fifth current 1555 flows from the second terminal 1512, through the tenth cell 1570, through an eleventh cell 1580, and to the third terminal 1514. The eleventh cell 1580 is disposed on the bank right select line 1420, and is also disposed between the third bit line 1524 and the third terminal conductor 1520.

For the fifth current 1575, the eighth cell 1560 is a neighbor of the cell to be read, the tenth cell 1570. Both the eighth cell 1560 and the tenth cell 1570 are disposed on the second word line 1505. The eighth cell 1560 does not allow enough current to flow through to the second terminal 15.12 to cause a cell type misread. The error is avoided because the source 515 to asymmetric drain 610 current for the eighth cell 1560 is much smaller than the asymmetric drain 610 to source 515 current of the tenth cell 1570, and substantial current would have to flow from the source 515 to the asymmetric drain 610 of the eighth cell 1560 to cause a cell type misread.

Figure 16:
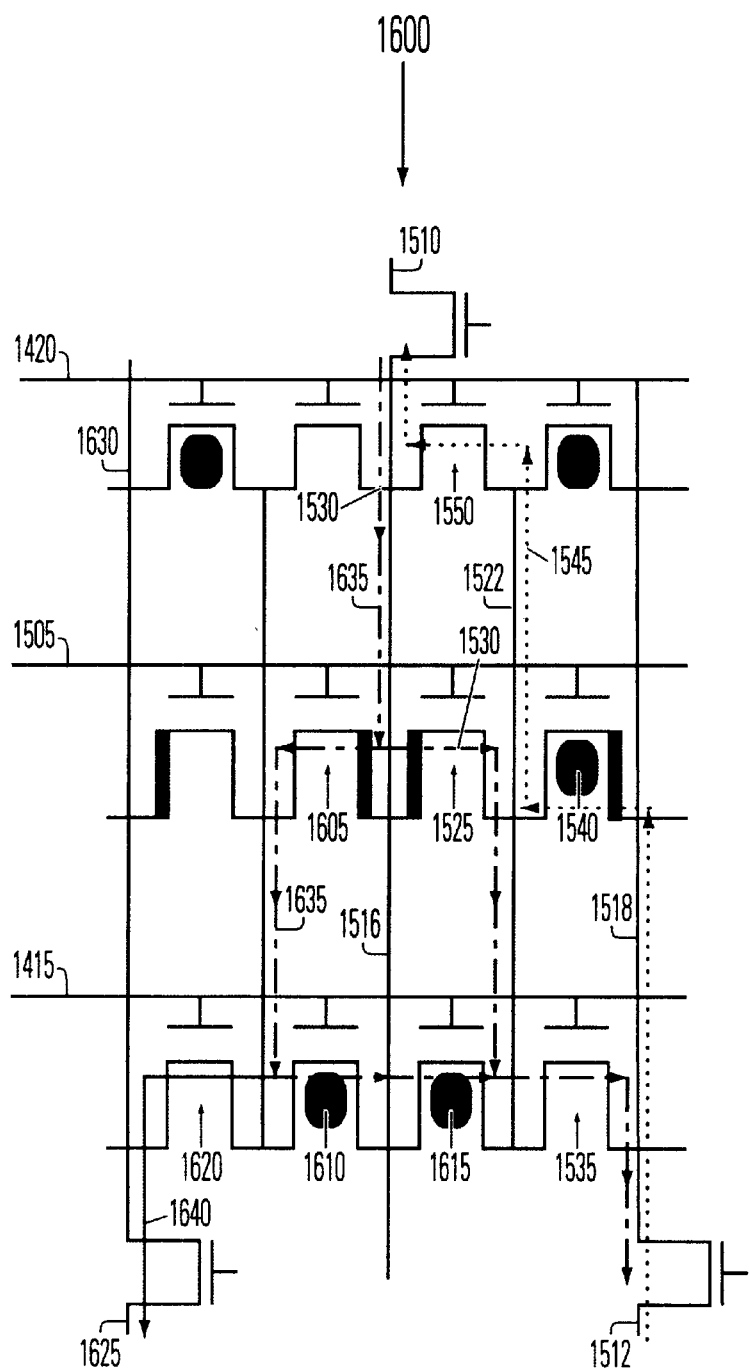
FIG. 16 is a schematic illustrating the blocking of alternate current paths in a memory cell array comprising asymmetric multilevel cells.

As shown in FIG. 16, a twelfth cell 1605 is disposed next to and to the left of the fourth cell 1525 on the second word line 1505. Also shown in FIG. 16 are a first select transistor 1610 and a second select transistor 1615 disposed on the bank select left line 1415. The first select transistor 1610 is disposed directly below the twelfth cell 1605, and the second select transistor 1615 is disposed directly below the fourth cell 1525. Both the first select transistor 1610 and the second select transistor 1615 are high Vt cells. A third select transistor 1620 is disposed on the bank select left line 1415 next to and to the left of the first select transistor 1610. A fourth terminal 1625 has a fourth terminal conductor 1630. The fourth terminal conductor 1630 is disposed to the first side (left side in FIG. 16) of the first terminal conductor 1516.

Unless the memory array comprising asymmetric multilevel cells 1500 has the features discussed in this paragraph, an alternate sixth current 1635 path could result in a cell type misread of the fourth cell 1525. If not blocked, the sixth current 1635 would flow from the first terminal 1510, through the twelfth cell 1605, through the first select transistor 1610, through the second select transistor 1615 and to the second terminal 1512. However, the sixth current 1635 is effectively blocked by the placement of high Vt cells (the first select transistor 1610 and the second select transistor 1615) in the sixth current 1635 path.

An alternate seventh current 1640 that could, if left unblocked, result in a cell type misread of the fourth cell 1525 is also shown in FIG. 16. If left unblocked, the seventh current 1640 would flow from the first terminal 1510, through the twelfth cell 1605, through the third select transistor 1620 and to the fourth terminal 1625. However, the seventh current 1640 is blocked during the read of the fourth cell 1525, by applying a bias condition to terminals in the array other than second terminal 1512. The bias condition applied to the other terminals, e.g., the fourth terminal 1625, is approximately equal to the potential of the first terminal 1510. Therefore, no current will flow to the fourth terminal 1625. The second terminal 1512 is at ground, thereby ensuring that the fourth cell 1525 is properly read using a unique current path.

The first terminal conductor 1516 continues downward below the bank left select line 1415. As the first terminal conductor 1516 extends beyond the bank left select line 1415, the first terminal conductor 1516 is connected to the bitline of another memory array (also referred to as a memory bank) within the integrated circuit. This connection enables the integrated circuit to read more than one memory array in the integrated circuit using the same sense amplifier.

Some embodiments of the invention comprise a method of reading a memory cell having an offset. These methods comprise providing an asymmetric memory cell having an asymmetric drain 610 separated from the channel 1020 by an offset 630. Some of these methods comprise providing a asymmetric multilevel memory cell 600.

What is claimed is:

1. An integrated circuit comprising:

an array of memory cells, the memory cells comprising transistors having channels in channel regions of a substrate, selected asymmetric multilevel memory cells in the array storing multiple bits;

a word line and a bit line coupled respectively with rows and columns of memory cells in the array by which to read data stored in the array, the bit line comprising a first patterned layer of the integrated circuit, the word line comprising a second patterned layer of the integrated circuit;

each of the selected asymmetric multilevel memory cells having a source formed in the substrate, a gate, a gate oxide disposed between the substrate and the gate; each of the selected asymmetric multilevel memory cells further comprising:

an asymmetric drain formed in the substrate, the asymmetric drain having a width;

a channel formed in the substrate, the channel in contact with the gate oxide and aligned with the gate, the channel extending from the source towards the asymmetric drain, the channel separated from the asymmetric drain by an offset, the channel adapted to store multiple bits, the channel adapted to form a depletion layer in the channel proximal to the gate oxide in response to a gate voltage; and an offset region disposed in the substrate and disposed between the channel and the asymmetric drain, the offset region having an initial conduction state, the offset region adapted to maintain the initial conduction state proximal to the gate oxide in response to the gate voltage; each of the selected asymmetric multilevel memory cells having a first asymmetric drain read current corresponding to a drain voltage and a source read current corresponding to a source voltage, the source voltage equal to the drain voltage, the drain read current having a different value than the source read current; the offset of each of the selected memory cell transistors sufficiently large to ensure that the selected memory cell transistors can only be accurately read by the corresponding word lines and corresponding bit lines in one direction, wherein the gate of each of the selected asymmetric multilevel memory cells is addressable by a corresponding word line, and the integrated circuit further comprises:

a sense amplifier having a sense amplifier conductor, the sense amplifier conductor having a first side and a second side;

a ground having a conductor, the ground conductor having a first side and a second side; the bit line disposed proximal to the ground conductor, the bit line disposed on the first side of the ground conductor, the bit line disposed proximal to the sense amplifier conductor, the bit line disposed on the second side of the sense amplifier conductor;

a first selected memory cell disposed between the bit line and the second side of the sense amplifier conductor, the asymmetric drain of the first selected memory cell in communication with the sense amplifier conductor; and a second selected memory cell disposed between the bit line and the first side of the ground conductor, the asymmetric drain of the second selected memory cell in communication with the ground conductor; the first selected memory cell and the second selected memory cell having a common source, the bit line in communication with the common source of the first and second selected memory cells; wherein, the first memory cell can only be accurately read by the corresponding word line and the corresponding bit line in a first direction, the second memory cell can only be accurately read by the corresponding word line and the corresponding bit line in a second direction, the second direction opposite the first direction.

2. The integrated circuit of claim 1, wherein the offset is in a range from 0.02 micrometers to 0.20 micrometers.

3. The integrated circuit of claim 1, wherein the offset region is adapted to form a depletion layer proximal to the gate oxide in response to the drain voltage; and the offset region is adapted to maintain the initial conduction state proximal to the gate oxide in response to the source voltage.

4. The integrated circuit of claim 1, further comprising bank select lines coupled with rows of transistors in the array, responsive to applied potentials on the bank select lines adapted to determine which selected asymmetric multilevel memory cell is read by the array, the rows of transistors coupled with the bank select lines comprising a plurality of high threshold voltage transistors, the high threshold being higher than said applied potentials on the bank select lines, the high threshold voltage transistors disposed in the array to block alternate current paths.

5. The integrated circuit of claim 1, wherein the first direction is from the asymmetric drain of the first selected memory cell to the source of the first selected memory cell, the second direction is from the asymmetric drain of the second selected memory cell to the source of the second selected memory cell.

6. The integrated circuit of claim 1, wherein the first direction is from the asymmetric drain of the first selected memory cell to the source of the first selected memory cell, the second direction is from the asymmetric drain of the second selected memory cell to the source of the second selected memory cell; a portion of the second direction current flows from the source of the first selected memory cell to the asymmetric drain of the first selected memory cell, the portion of the second direction current in the first selected memory cell is smaller than forty percent of the second direction current of the second selected memory cell; a portion of the first direction current flows from the source of the second selected memory cell to the asymmetric drain of the second selected memory cell, the portion of the first direction current in the second selected memory cell is smaller than forty percent of the first direction current of the first selected memory cell.

* * * * *